United States Patent
Fan et al.

(10) Patent No.: US 10,175,138 B1
(45) Date of Patent: Jan. 8, 2019

(54) PACKAGING STRUCTURE AND DETECTION METHOD FOR THE TIGHTNESS THEREOF AND MANUFACTURING METHOD FOR THE SAME, DISPLAY APPARATUS, AND PHOTOVOLAIC DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Xiaowang Fan, Beijing (CN); Liang Zhang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 0 days.

(21) Appl. No.: 15/959,583

(22) Filed: Apr. 23, 2018

(30) Foreign Application Priority Data

Aug. 17, 2017 (CN) .......................... 2017 1 0707895

(51) Int. Cl.
    *G01M 3/38*     (2006.01)
    *H01L 27/32*     (2006.01)
    *H01L 31/048*     (2014.01)

(52) U.S. Cl.
    CPC .............. *G01M 3/38* (2013.01); *H01L 27/32* (2013.01); *H01L 31/0481* (2013.01)

(58) Field of Classification Search
    CPC ....... G01M 3/38; H01L 27/32; H01L 31/0481
    See application file for complete search history.

(56) References Cited

U.S. PATENT DOCUMENTS

| | | | | |
|---|---|---|---|---|
| 4,455,810 | A * | 6/1984 | Kreager | B65B 57/06 53/451 |
| 6,052,224 | A * | 4/2000 | Richardson | B01L 3/508 359/398 |
| 2010/0047935 | A1 * | 2/2010 | Chen | H01L 33/52 438/26 |
| 2012/0049222 | A1 * | 3/2012 | Yoshizumi | H01L 25/0753 257/98 |
| 2012/0299036 | A1 * | 11/2012 | Liu | H01L 33/56 257/98 |
| 2013/0062656 | A1 * | 3/2013 | Lee | H01L 25/0753 257/99 |
| 2016/0307879 | A1 * | 10/2016 | Lien | H01L 25/0753 |
| 2017/0110443 | A1 * | 4/2017 | Huang | H01L 33/54 |
| 2018/0122996 | A1 * | 5/2018 | He | H01L 33/44 |

* cited by examiner

*Primary Examiner* — Mark R Gaworecki
(74) *Attorney, Agent, or Firm* — Calfee, Halter & Griswold LLP

(57) ABSTRACT

The disclosure provides a packaging structure and a detection method for the tightness thereof and a manufacturing method for the same, a display apparatus, and a photovoltaic device. The packaging structure includes: a substrate base-plate and a packaging cover plate arranged opposite to each other, and a packaging adhesive formed between the substrate base-plate and the packaging cover plate and used for connecting the substrate base-plate and the packaging cover plate to form a sealed space, in which packaging adhesive a fluorescent agent is mixed.

15 Claims, 3 Drawing Sheets

PACKAGING STRUCTURE AND DETECTION METHOD FOR THE TIGHTNESS THEREOF AND MANUFACTURING METHOD FOR THE SAME, DISPLAY APPARATUS, AND PHOTOVOLAIC DEVICE

RELATED APPLICATIONS

This application claims the benefit of the Chinese patent application No. 201710707895.6 filed on Aug. 17, 2017, the entire disclosure of which is incorporated herein by reference.

TECHNICAL FIELD

The disclosure relates to the field of packaging structure technology, and in particular, to a packaging structure and a detection method for the tightness thereof and a manufacturing method for the same, a display apparatus, and a photovoltaic device.

BACKGROUND

For an apparatus employing a packaging structure such as a photovoltaic device, a display apparatus, etc. in the related art, the tightness of the packaging between its two layers of plates needs to be detected by manually contacting and observing the packaging structure, there is a subjective judgment error and it is inevitable to bring about hidden trouble of particulate impurities or scratching the packaging structure, etc. in the process of detection.

SUMMARY

According to an embodiment of a first aspect of the disclosure, there is proposed a packaging structure including: a substrate base-plate and a packaging cover plate arranged opposite to each other, and a packaging adhesive formed between the substrate base-plate and the packaging cover plate and used for connecting the substrate base-plate and the packaging cover plate to form a sealed space, in which packaging adhesive a fluorescent agent is mixed.

Optionally, the packaging adhesive is located at the periphery of the packaging cover plate and the substrate base-plate.

According to another embodiment of the disclosure, the packaging adhesive is a UV adhesive. As such, it is convenient to bond the packaging cover plate and the substrate base-plate.

According to an embodiment of a second aspect of the disclosure, there is proposed a display apparatus including a packaging structure as described in the embodiment of the first aspect of the disclosure.

Optionally, the display apparatus is a plasma display apparatus, an organic light emitting diode display apparatus or a liquid crystal display apparatus.

According to an embodiment of a third aspect of the disclosure, there is proposed a photovoltaic device including a packaging structure as described in the embodiment of the first aspect of the disclosure.

According to an embodiment of a fourth aspect of the disclosure, there is proposed a detection method for the tightness of a packaging structure as described in the embodiment of the first aspect of the disclosure.

The detection method includes the following steps of: scanning to detect the width of the packaging adhesive, and judging the tightness of the packaging structure according to the width of the packaging adhesive.

Optionally, the width of the packaging adhesive is detected by scanning, and if the width of the packaging adhesive is less than a first threshold, it is judged that air leakage occurs to the packaging structure, and if the width of the packaging adhesive is greater than a second threshold, it is judged that air leakage does not occur to the packaging structure, wherein the first threshold is less than the second threshold.

According to an embodiment of a fifth aspect of the disclosure, there is proposed a manufacturing method for a packaging structure as described in the embodiment of the first aspect of the disclosure.

The manufacturing method includes the following steps of: providing a packaging cover plate and a substrate base-plate, providing a packaging adhesive in which packaging adhesive a fluorescent agent is mixed, utilizing the packaging adhesive for sealing between the packaging cover plate and the substrate base-plate, and scanning to detect the width of the packaging adhesive and judging the tightness of the packaging structure according to the width of the packaging adhesive.

Additional aspects and advantages of the disclosure will be partially given in the following description, and a part thereof will become clear from the following description or will be learned from the practice of the disclosure.

BRIEF DESCRIPTION OF THE DRAWINGS

The above and/or additional aspects and advantages of the disclosure will become clear and easily understood from the description of embodiments in conjunction with the following drawings, wherein.

DETAILED DESCRIPTION OF THE INVENTION

Figure 1:
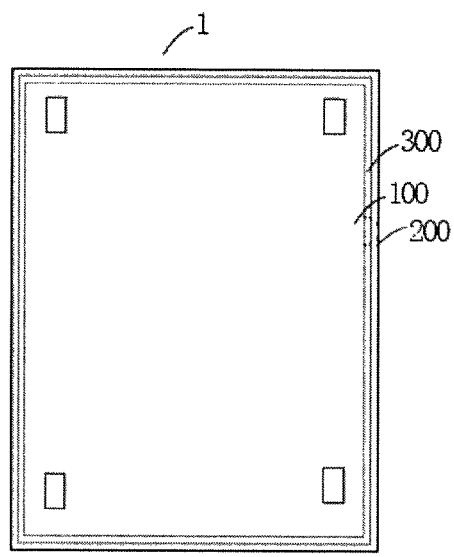
FIG. 1 is a structure diagram of a packaging structure according to an embodiment of the disclosure.

In the following embodiments of the disclosure will be described in detail, and the examples of the embodiments will be illustrated in the drawings, wherein identical or similar reference signs denote identical or similar elements or elements that have identical or similar functions throughout. In the following, the embodiments described with reference to the drawing are exemplary, only used for explaining the disclosure, and may not be construed as limiting the disclosure.

REFERENCE SIGNS

1 Packaging structure
100 Packaging cover plate
200 Substrate base-plate
300 Packaging adhesive
310 Fluorescent agent.

In the following, a packaging structure 1 according to an embodiment of the disclosure will be described with reference to the drawings.

As shown in FIG. 1, the packaging structure 1 according to the embodiment of the disclosure includes a packaging cover plate 100 and a substrate base-plate 200.

The substrate base-plate 200 and the packaging cover plate 100 are arranged opposite to each other. A packaging adhesive 300 is formed between the substrate base-plate 200 and the packaging cover plate 100 and used for connecting the substrate base-plate 200 and the packaging cover plate 100 to form a sealed space, in which packaging adhesive 300 a fluorescent agent 310 is mixed.

In particular, the materials of the substrate base-plate 200 and the packaging cover plate 100 are not limited, and appropriate materials may be selected according to specific needs. For example, for the substrate base-plate 200 and the packaging cover plate 100, materials such as glass, resin, sapphire, etc. may be selected, and a functional film layer, a pattern array, etc. may be produced on the substrate base-plate 200 and/or the packaging cover plate 100 as needed.

For the packaging structure 1 according to the embodiment of the disclosure, in the packaging adhesive 300 is mixed the fluorescent agent 310. For example, sealing is done between the substrate base-plate 200 and the packaging cover plate 100 of the packaging structure 1 by the packaging adhesive 300, in the packaging adhesive 300 is mixed the fluorescent agent 310, the shape in terms of wideness or narrowness and the size of the packaging adhesive 300 may be detected by detecting the fluorescent agent 310, and it is judged whether the packaging structure 1 leaks air by the wideness or narrowness and the size of the packaging adhesive 300. As compared to the way of manual detection by an operator in the related art, it may avoid the existence of a subjective error, improve the accuracy and reliability of air leakage detection of the packaging structure 1, and thereby improve the production quality of the packaging structure 1 and improve the reliability and stability of its use. Moreover, it causes the air leakage detection of the packaging structure 1 to be faster and more convenient, and it may reduce the workload of the operator, save the time and energy of the operator, improve the automation level of detection, increase the efficiency of air leakage detection, facilitate the operation of the operator, and facilitate improving the operating experience of the operator. In addition, it may further avoid that the packaging structure 1 is scratched by detecting air leakage manually and impurity particles enter the packaging structure 1, and further guarantee the production quality of the packaging structure 1.

Therefore, the packaging structure 1 according to the embodiment of the disclosure has advantages of reliable detection and a high degree of automation, etc.

In particular, as shown in FIG. 1, the packaging adhesive 300 is sandwiched between the packaging cover plate 100 and the substrate base-plate 200. This facilitates the arrangement of the packaging adhesive 300, and facilitates sealing the packaging cover plate 100 and the substrate base-plate 200 by the packaging adhesive 300.

Optionally, as shown in FIG. 1, the packaging adhesive 300 is located at the periphery of the packaging cover plate 100 and the substrate base-plate 200. This not only facilitates the arrangement and air leakage detection of the packaging adhesive 300, but also facilitates controlling the effective use area of the packaging structure 1.

In particular, the packaging adhesive 300 is a UV adhesive. As such, it is convenient to bond the packaging cover plate 100 and the substrate base-plate 200.

Figure 2:
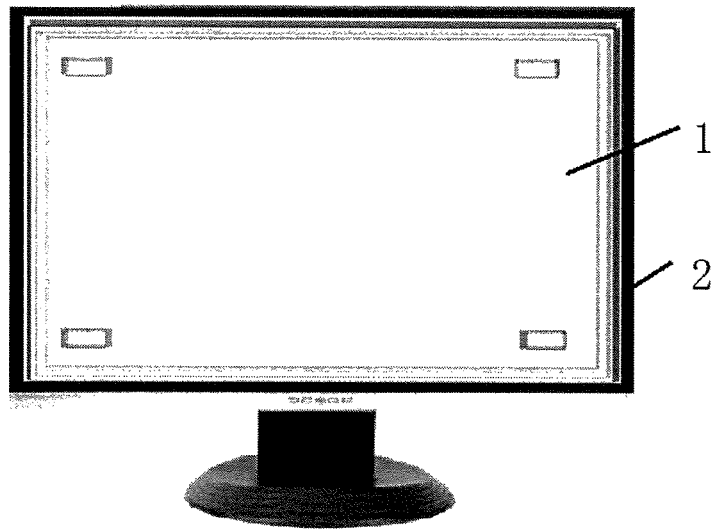
FIG. 2 is a structure diagram of a display apparatus according to an embodiment of the disclosure.

In the following, a display apparatus 2 according to an embodiment of the disclosure will be described. As shown in FIG. 2, the display apparatus 2 according to the embodiment of the disclosure includes a packaging structure 1 according to the above embodiment of the disclosure.

By utilizing the packaging structure 1 according to the above embodiment of the disclosure, the display apparatus 2 according to the embodiment of the disclosure may not only avoid the occurrence of the phenomenon of air leakage to the display apparatus 2, improve the sealing effect of the display apparatus 2, and improve the operational reliability and stability of the display apparatus 2, but also reduce the production cycle of the display apparatus 2, and improve the production efficiency of the display apparatus 2.

In particular, the display apparatus 2 is a plasma display apparatus, an organic light emitting diode display apparatus or a liquid crystal display apparatus. This facilitates the air leakage detection of the packaging structure 1 in the plasma display apparatus, the organic light emitting diode display apparatus or the liquid crystal display apparatus.

Figure 3:
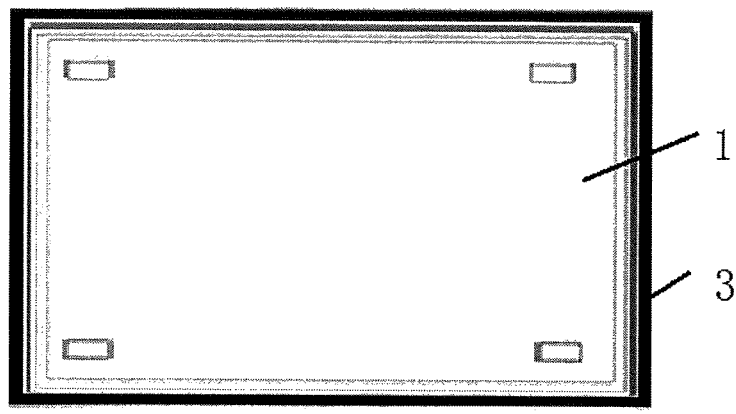
FIG. 3 is a structure diagram of a photovoltaic device according to an embodiment of the disclosure.

In the following, a photovoltaic device 3 according to an embodiment of the disclosure will be described. As shown in FIG. 3, the photovoltaic device 3 according to the embodiment of the disclosure includes a packaging structure 1 according to the above embodiment of the disclosure.

For the photovoltaic device 3 according to the embodiment of the disclosure, by utilizing the packaging structure 1 according to the above embodiment of the disclosure, the photovoltaic device 3 may be effectively sealed, the sealing performance of the photovoltaic device 3 is guaranteed, and the working performance of the photovoltaic device 3 is improved. Meanwhile, it may be possible to simplify the production process of the photovoltaic device 3, and improve the production efficiency of the photovoltaic device 3.

In the following, a detection method for the tightness of a packaging structure according to an embodiment of the disclosure will be described.

Figure 6:
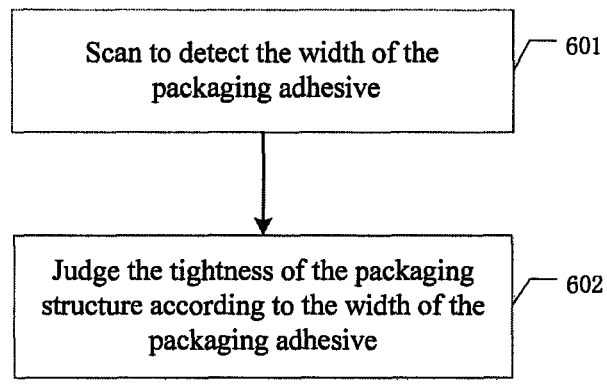
FIG. 6 is a flow chart of a detection method for the tightness of a packaging structure according to an embodiment of the disclosure.

As shown in FIG. 6, the detection method includes the following steps: step 601, scanning to detect the width of the packaging adhesive, and step 602, judging the tightness of the packaging structure according to the width of the packaging adhesive.

The detection method for the tightness of a packaging structure according to the embodiment of the disclosure may not only avoid the existence of a subjective error of an operator, improve the accuracy and reliability of tightness detection of the packaging structure 1, but also improve the automation level of detection, increase the efficiency of air leakage detection, facilitate the operation of the operator, and facilitate improving the operating experience of the operator.

Figure 4:
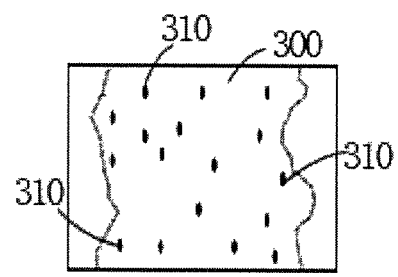
FIG. 4 is a partially enlarged drawing of a packaging structure according to an embodiment of the disclosure, wherein air leakage does not occur to the packaging structure.
Figure 5:
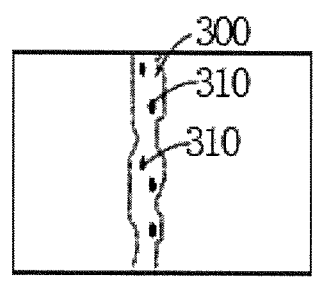
FIG. 5 is a partially enlarged drawing of a packaging structure according to an embodiment of the disclosure, wherein air leakage occurs to the packaging structure.

In particular, as shown in FIG. 4 to FIG. 5, the width of the packaging adhesive 300 is detected by scanning, and if the width of the packaging adhesive 300 is less than a first threshold, it is judged that air leakage occurs to the packaging structure 1 (as shown in FIG. 5), and if the width of the packaging adhesive 300 is greater than a second threshold, it is judged that air leakage does not occur to the packaging structure 1 (as shown in FIG. 4), wherein the first threshold is less than the second threshold. This may cause the air leakage detection of the packaging structure 1 to be more accurate and reliable, and further improve the sealing reliability of the packaging structure 1.

Therein, the first threshold and the second threshold may be set according to specific needs, and different factors such as product design requirements, selected materials, use environments, etc. will affect the selection of the first threshold and the second threshold, which will not be limited by the disclosure. For example, the first threshold may be selected to be 400 microns, 500 microns, etc., and the second threshold may be selected to be 17000 microns, 18000 microns, etc.

Figure 7:
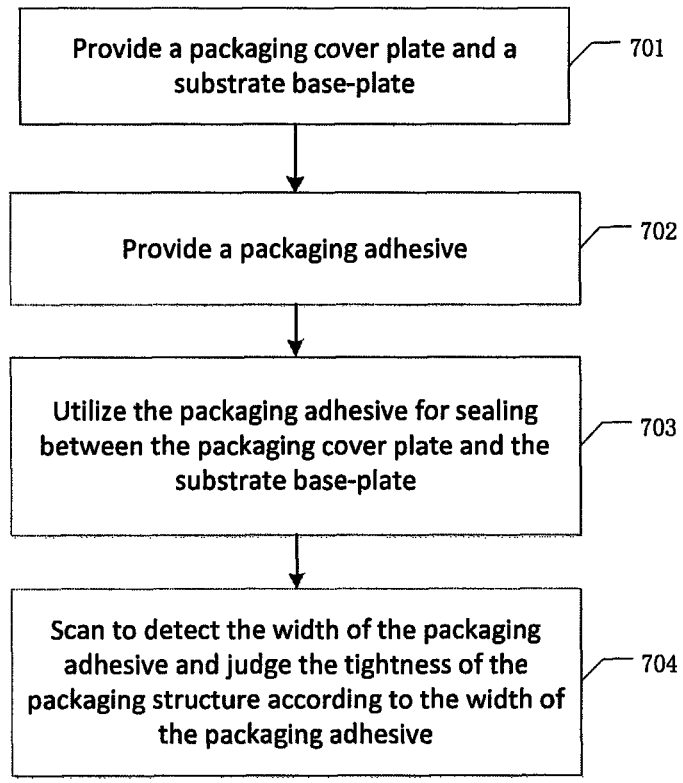
FIG. 7 is a flow chart of a manufacturing method for a packaging structure according to an embodiment of the disclosure.

In the following, a manufacturing method for a packaging structure according to an embodiment of the disclosure will be described in conjunction with FIG. 7.

The manufacturing method includes the following steps: step 701, providing a packaging cover plate and a substrate base-plate, step 702, providing a packaging adhesive in which packaging adhesive a fluorescent agent is mixed, step 703, utilizing the packaging adhesive for sealing between the packaging cover plate and the substrate base-plate, and step 704, scanning to detect the width of the packaging adhesive and judging the tightness of the packaging structure according to the width of the packaging adhesive.

The manufacturing method for a packaging structure according to the embodiment of the disclosure may not only improve the production quality of the packaging structure 1, improve the reliability and stability of its use, but also avoid that the packaging structure 1 is scratched by detecting the tightness manually and impurity particles enter the packaging structure 1, and further guarantee the production quality of the packaging structure 1.

Other compositions and operations of the packaging structure 1 according to the embodiment of the disclosure are known to the person having ordinary skills in the art, and will not be described in detail here.

In the description of the disclosure, it needs to be understood that, the orientation or position relationship indicated by the terms "width", "on", "inside", "outside", etc. is an orientation or position relationship based on what is shown in the drawings, it is only for the convenience of describing the disclosure and simplifying the description, but does not indicate or imply that the apparatus or element referred to must have a specific orientation, and be constructed and operated in a specific orientation, and therefore cannot be understood as limiting the disclosure. In addition, a feature defined by "first", "second" may explicitly or implicitly include one or more said feature. In the description of the disclosure, the meaning of "more" is two or more than two, unless stated otherwise.

In the description of the disclosure, it needs to be noted that, unless definitely prescribed and defined otherwise, the term "connection" should be understood in a broad sense, for example, it may be a fixed connection, or also may be a removable connection, or connected integrally, it may be a mechanical connection, or also may be an electrical connection, it may be connected directly, or also may be connected indirectly by an intermediate medium, or may be internal communication between two elements. For the person having ordinary skills in the art, the specific meaning of the above terms in the disclosure may be understood according to the specific circumstances.

In the description of this specification, a description with reference to the terms "an embodiment", "example", etc. indicates that a specific feature, structure, material or characteristic described in conjunction with the embodiment or example is contained in at least one embodiment or example of the disclosure. In this specification, schematic expressions for the above terms need not necessarily refer to the same embodiment or example. Moreover, the described specific feature, structure, material or characteristic may be combined in an appropriate way in any one or more embodiment or example.

Although the embodiments of the disclosure have already been illustrated and described, it may be understood by the person having ordinary skills in the art that various changes, modifications, replacements and variations may be made to the embodiments without departing from the principle and purpose of the disclosure, and the scope of the disclosure is defined by the claims and their equivalents.

What is claimed is:

1. A packaging structure, comprising:
   a substrate base-plate and a packaging cover plate arranged opposite to each other, and
   a packaging adhesive formed between the substrate base-plate and the packaging cover plate and used for connecting the substrate base-plate and the packaging cover plate to form a sealed space, in which packaging adhesive a fluorescent agent is mixed.

2. The packaging structure as claimed in claim 1, wherein the packaging adhesive is located at the periphery of the packaging cover plate and the substrate base-plate.

3. The packaging structure as claimed in claim 1, wherein the packaging adhesive is a UV adhesive.

4. A display apparatus, comprising a packaging structure as claimed in claim 1.

5. The display apparatus as claimed in claim 4, wherein the packaging adhesive is located at the periphery of the packaging cover plate and the substrate base-plate.

6. The display apparatus as claimed in claim 5, wherein the packaging adhesive is a UV adhesive.

7. The display apparatus as claimed in claim 4, wherein the display apparatus is a plasma display apparatus, an organic light emitting diode display apparatus or a liquid crystal display apparatus.

8. A photovoltaic device, comprising a packaging structure as claimed in claim 1.

9. The photovoltaic device as claimed in claim 8, wherein the packaging adhesive is located at the periphery of the packaging cover plate and the substrate base-plate.

10. The photovoltaic device as claimed in claim 8, wherein the packaging adhesive is a UV adhesive.

11. A detection method for the tightness of a packaging structure,
    the packaging structure comprising:
    a substrate base-plate and a packaging cover plate arranged opposite to each other, and
    a packaging adhesive formed between the substrate base-plate and the packaging cover plate and used for connecting the substrate base-plate and the packaging cover plate to form a sealed space, in which packaging adhesive a fluorescent agent is mixed,
    the detection method comprising the following steps of:
    scanning to detect the width of the packaging adhesive, and judging the tightness of the packaging structure according to the width of the packaging adhesive.

12. The detection method as claimed in claim 11, wherein the packaging adhesive is located at the periphery of the packaging cover plate and the substrate base-plate.

13. The detection method as claimed in claim 11, wherein the packaging adhesive is a UV adhesive.

14. The detection method as claimed in claim 11, wherein the width of the packaging adhesive is detected by scanning, and if the width of the packaging adhesive is less than a first threshold, it is judged that air leakage occurs to the packaging structure, and if the width of the packaging adhesive is greater than a second threshold, it is judged that air leakage does not occur to the packaging structure, wherein the first threshold is less than the second threshold.

15. A manufacturing method for a packaging structure, comprising the following steps of:
   providing a packaging cover plate and a substrate base-plate,
   providing a packaging adhesive in which packaging adhesive a fluorescent agent is mixed,
   utilizing the packaging adhesive for sealing between the packaging cover plate and the substrate base-plate, and
   scanning to detect the width of the packaging adhesive and judging the tightness of the packaging structure according to the width of the packaging adhesive.

* * * * *